(12) United States Patent
Lee et al.

(10) Patent No.: US 12,387,998 B2
(45) Date of Patent: Aug. 12, 2025

(54) QFN PACKAGE AND FABRICATING METHOD OF THE SAME

(71) Applicant: UNITED MICROELECTRONICS CORP., Hsin-Chu (TW)

(72) Inventors: Chiu-Feng Lee, Taoyuan (TW); Chen-Hsiao Wang, Hsinchu (TW); Kai-Kuang Ho, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 521 days.

(21) Appl. No.: 17/985,912

(22) Filed: Nov. 14, 2022

(65) Prior Publication Data
US 2024/0128168 A1    Apr. 18, 2024

(30) Foreign Application Priority Data
Oct. 12, 2022    (CN) .......................... 202211246071.0

(51) Int. Cl.
*H01L 23/495* (2006.01)
*H01L 21/48* (2006.01)
*H01L 23/00* (2006.01)

(52) U.S. Cl.
CPC .... *H01L 23/49568* (2013.01); *H01L 21/4821* (2013.01); *H01L 23/49503* (2013.01); *H01L 23/4952* (2013.01); *H01L 23/49534* (2013.01); *H01L 23/49548* (2013.01); *H01L 23/49579* (2013.01); *H01L 24/48* (2013.01); *H01L 24/49* (2013.01); *H01L 2224/48011* (2013.01); *H01L 2224/48091* (2013.01); *H01L 2224/48249* (2013.01); *H01L 2224/48257* (2013.01); *H01L 2224/4903* (2013.01); *H01L 2224/49052* (2013.01); *H01L 2224/49175* (2013.01); *H01L 2924/182* (2013.01)

(58) Field of Classification Search
CPC .................................................. H01L 23/49568
USPC .......................................................... 257/675
See application file for complete search history.

(56) References Cited

U.S. PATENT DOCUMENTS

| | | | | |
|---|---|---|---|---|
| 5,780,928 | A * | 7/1998 | Rostoker | H01L 23/427 257/713 |
| 6,429,513 | B1 * | 8/2002 | Shermer, IV | H01L 23/427 257/E23.092 |
| 7,834,448 | B2 * | 11/2010 | Gerbsch | H01L 23/473 361/689 |
| 7,990,711 | B1 | 8/2011 | Andry | |
| 2005/0083652 | A1 * | 4/2005 | Jairazbhoy | H01L 23/473 361/689 |
| 2023/0019930 | A1 * | 1/2023 | Yoo | H01L 23/44 |
| 2023/0284421 | A1 * | 9/2023 | Malouin | G06F 1/20 |

* cited by examiner

*Primary Examiner* — Ajay Arora
(74) *Attorney, Agent, or Firm* — Winston Hsu

(57) ABSTRACT

A QFN package includes a copper lead frame. The copper lead frame includes a die paddle. A die is fixed on the die pad. A coolant passage is disposed within the die paddle. An inlet passage connects to one end of the coolant passage. An outlet passage connects to another end of the coolant passage. A mold compound encapsulates the copper lead frame and the die.

20 Claims, 5 Drawing Sheets

QFN PACKAGE AND FABRICATING METHOD OF THE SAME

BACKGROUND OF THE INVENTION

1. Field of the Invention

The present invention relates to a quad flat no leads (QFN) package and a fabricating method of the same, and more particularly to a QFN package with a coolant passage and a fabricating method of the same.

2. Description of the Prior Art

Semiconductor packaging processes have been widely used to electrically connect a semiconductor chip to an external component with a better reliability and also to protect the semiconductor chip from damages caused by external conditions. Among several package technologies, quad flat no lead (QFN) packaging technology is used to produce packaged die which are not significantly bigger than the actual die. An ongoing challenge in QFN package includes the removal of thermal heat generated by active components of the integrated circuit. Because the operating temperature of the QFN may be as high as 125° C., it is no longer sufficient to dissipate heat only through the circuit board or heat sink.

SUMMARY OF THE INVENTION

In view of this, a QFN package using coolant for heat dissipation is provided to solve the above mentioned problem.

According to a preferred embodiment of the present invention, a QFN package includes a copper lead frame. The copper lead frame includes a die paddle, a pad, a first extend portion and a second extend portion, wherein the first extend portion and the second extend portion are respectively extend from the die paddle. A die is fixed on the die paddle, wherein the die includes a conductive bond disposed at a surface of the die. A coolant passage is disposed within the die paddle. An inlet passage is disposed within the first extend portion, wherein the inlet passage connects to one end of the coolant passage. An outlet passage is disposed within the second extend portion, wherein the outlet passage connects to another end of the coolant passage. A wire electrically connects to the pad and the conductive bond. A mold compound encapsulates the copper lead frame, the die and the wire.

A fabricating method of a QFN package includes providing a upper copper lead frame and a lower copper lead frame, wherein the upper copper lead frame includes a first pattern, the lower copper lead frame includes a second pattern, and the first pattern is the same as the second pattern. Next, the upper copper lead frame is adhered to the lower copper lead frame to form a copper lead frame, wherein the first pattern completely overlaps the second pattern, the copper lead frame includes a die paddle and a pad, and a coolant passage is disposed within the die paddle. Next, a die is provided and the die is fixed on the die paddle. A wire is provided to electrically connect the pad and the die. Finally, a mold compound is formed to encapsulate the copper lead frame, the die and the wire.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 depict a fabricating method of a QFN package according to a preferred embodiment of the present invention, wherein:

FIG. 2 is a fabricating step following FIG. 1.

DETAILED DESCRIPTION

Figure 1:
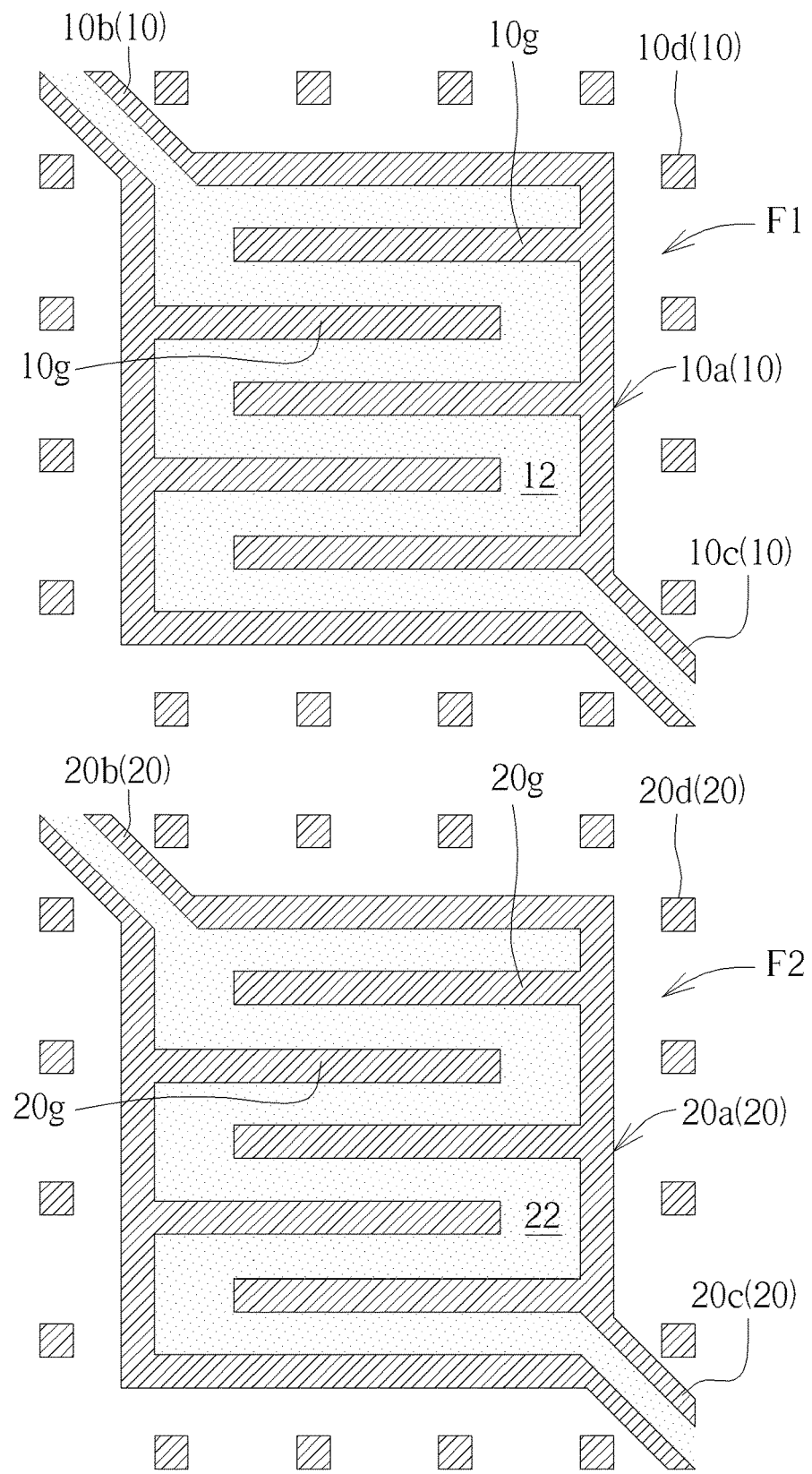
Figure 2:
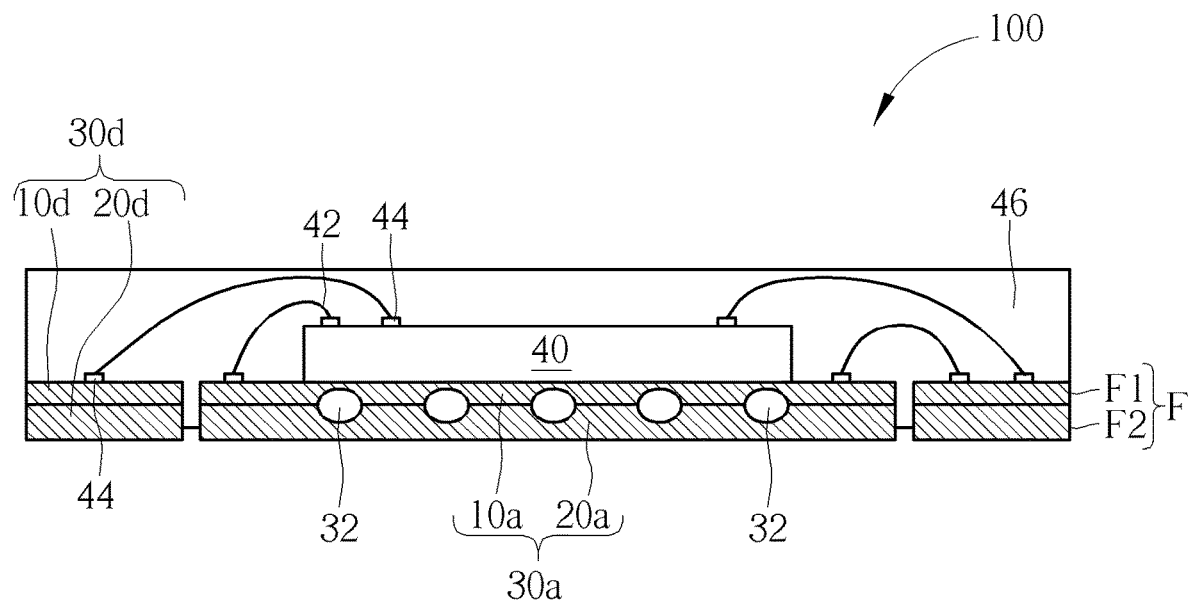
Figure 3:
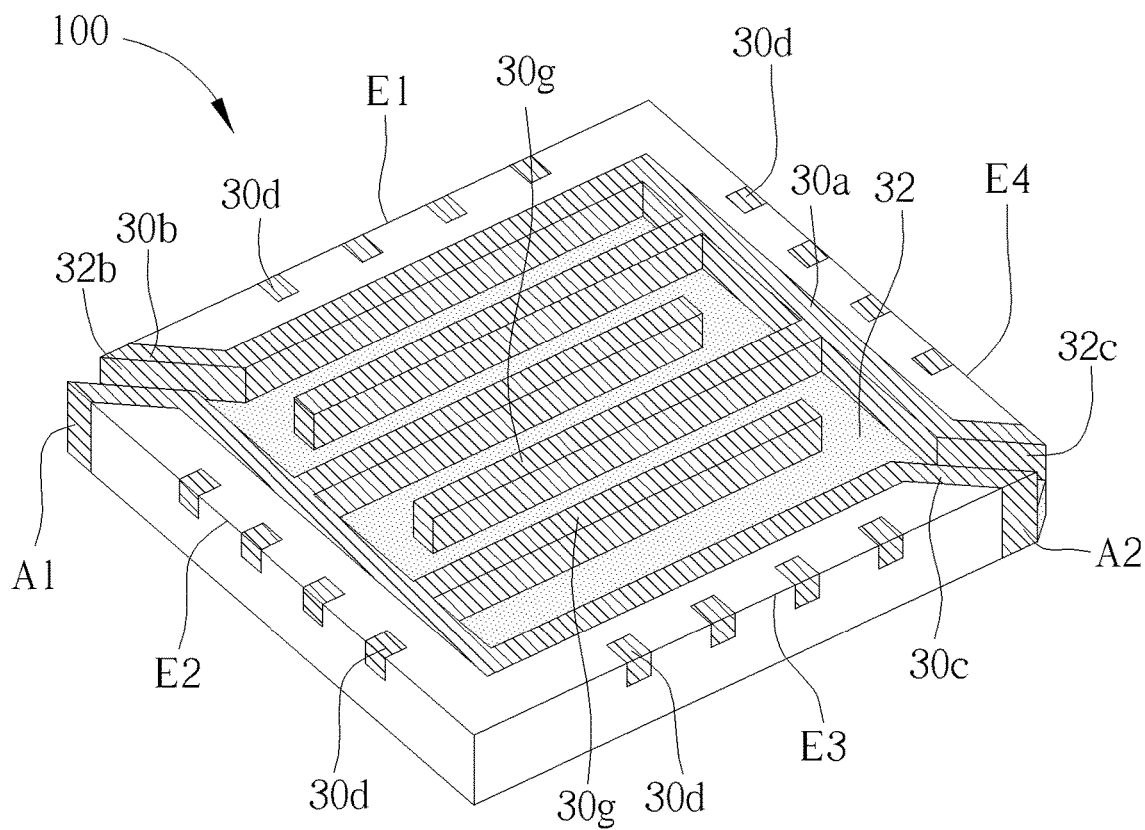
FIG. 3 depicts a coolant passage within a QFN package and pads outside of the QFN package.

FIG. 1 to FIG. 2 depict a fabricating method of a quad flat no leads (QFN) package according to a preferred embodiment of the present invention. FIG. 3 depicts a coolant passage within a QFN package and pads outside of the QFN package. Although the coolant passage can't be seen from outside of the QFN package, in order to show the position of the coolant passage, a perspective view is used.

As shown in FIG. 1, a upper copper lead frame F1 and a lower copper lead frame F2 are provided. The upper copper lead frame F1 includes a first pattern 10. The lower copper lead frame F2 includes a second pattern 20. The first pattern 10 is entirely the same as the second pattern 20. The first pattern 10 and the second pattern 20 can be formed by a stamping process or an etching process. The first pattern 10 includes a die paddle pattern 10a, a first extend pattern 10b, a second extend pattern 10c and numerous pad patterns 10d. The die paddle pattern 10a is in a shape of a rectangle or a square. The first extend pattern 10b and the second extend pattern 10c connect to the die paddle pattern 10a. The first extend pattern 10b and the second extend pattern 10c respectively extend from two opposing corners of the die paddle pattern 10a. Numerous pad patterns 10d surround four sides of the die paddle pattern 10a, and all of the pad patterns 10d do not contact the die paddle pattern 10a, the first extend pattern 10b and the second extend pattern 10c.

Moreover, the die paddle pattern 10a includes an interdigitated pattern 10g formed by the upper copper lead frame F1. A passage pattern 12 is between the interdigitated pattern 10g. The passage pattern 12 is in a shape of a square wave when viewing from the top of the upper copper lead frame F1. The passage pattern 12 is a trench which can be formed by removing part of the upper copper lead frame F1 without penetrating the upper copper lead frame F1. That is, a bottom of the passage pattern 12 is still upper copper lead frame F1. The lower copper lead frame F2 includes a second pattern 20 which is entirely the same as the first pattern 10. The description of the second pattern 20 is therefore omitted.

As shown in FIG. 2 and FIG. 3, the upper copper lead frame F1 is adhered to the lower copper lead frame F2 to form a copper lead frame F. The first pattern 10 completely overlaps the second pattern 20. The copper lead frame F includes a die paddle 30a and numerous pads 30d. A coolant passage 32 is disposed within the die paddle 30a. After that, a die 40 is provided. The die 40 is fixed onto the die paddle 30a. The die 40 can be a high power semiconductor die such a gallium nitride die, but not limited to it. The die 40 can also be a silicon-based die. Subsequently, numerous wires 42 are provided. Each of the wires 42 electrically connects one of the pads 30d to a conductive bond 44 on the die 40. Finally, a mold compound 46 is formed to encapsulate the copper lead frame F, the die 40 and the wires 42. In details, the die paddle pattern 10a of the first pattern 10 entirely overlaps the die paddle pattern 20a of the second pattern 20 and the die paddle pattern 10a is adhered to the die paddle pattern 20a to form a die paddle 30a. The first extend pattern 10b and the second extend pattern 10c of the first pattern 10 entirely overlap the first extend pattern 20b and the second extend pattern 20c of the second pattern 20 and the first extend pattern 10b and the second extend pattern 10c are adhered to the first extend pattern 20b and the second extend pattern 20c to form a first extend portion 30b and a second extend portion 30c. The pad pattern 10d of the first pattern 10 entirely overlaps the pad pattern 20d of the second pattern 20 and the pad pattern 10d is adhered to the pad pattern 20d to form pads 30d. The passage pattern 12 of the first pattern 10 entirely overlaps the passage pattern 22 of the second pattern 20 to become a coolant passage 32. The interdigitated pattern 10g of the first pattern 10 overlaps the interdigitated pattern 20g of the second pattern 20, and the interdigitated pattern 10g is adhered to the interdigitated pattern 20g to form an interdigitated pattern 30g. The die 40 is directly on the coolant passage 32. Now, a QFN package of the present invention is completed. Moreover, a bottom of the die paddle 30a and bottoms of the pads 30d are exposed from the mold compound 46. The bottom of the die paddle 30a and the bottoms of the pads 30d are aligned. The pads 30d can be connected to a PCB afterwards. The exposed die paddle 30a can also help for heat dissipation.

FIG. 2 and FIG. 3 depict a QFN package according to a preferred embodiment of the present invention.

As shown in FIG. 2 and FIG. 3, a QFN package 100 includes a copper lead frame F. The copper lead frame F includes die paddle 30a, numerous pads 30d, a first extend portion 30b and a second extend portion 30c. The first extend portion 30b and the second extend portion 30c extend from the die paddle 30a. A die 40 includes numerous conductive bonds 44 disposed on a surface of the die 40. The die 40 is fixed on the die paddle 30a. A coolant passage 32 is disposed within the die paddle 30a. An inlet passage 32b is disposed within the first extend portion 30b, wherein the inlet passage 32b connects to one end of the coolant passage 32. An outlet passage 32c is disposed within the second extend portion 30c, wherein the outlet passage 32c connects to another end of the coolant passage 32. A wire 42 electrically connects to one of the pads 30d and one of the conductive bonds 44. A mold compound 46 encapsulates the copper lead frame F, the die 40 and the wire 42.

An interdigitated pattern 30g is disposed within the die paddle 30a, and the coolant passage 32 is between the interdigitated pattern 30g. The coolant passage 32 is in a shape of a square wave when viewing from a top view. Besides, the mold compound 46 includes a first sidewall E1, a second sidewall E2, a third sidewall E3 and a fourth sidewall E4. The first sidewall E1 is opposed to the third sidewall E3. The second sidewall E2 is opposed to the fourth sidewall E4. A first corner A1 is a region where the first sidewall E1 connecting to the second sidewall E2. A second corner A2 is a region where the third sidewall E3 connecting to the fourth sidewall E4. The first extend portion 30b connects to the first corner A1, and the second extend portion 30c connects to the second corner A2. Numerous pads 30d are respectively disposed on the first sidewall E1, the second sidewall E2, the third sidewall E3 and the fourth sidewall E4. A bottom of the die paddle 30a and a bottom of each of the pads 30d are exposed from the mold compound 46. The bottom of the die paddle 30a and the bottom of each of the pad 30d are aligned.

When cooling the die 40, coolant can be input from the inlet passage 32b to enter the coolant passage 32. After heat exchange, coolant flows out from the outlet passage 32c. In this way, the heat of the die 40 can be dissipated. Coolant can be water, oil, liquid nitrogen, fluorocarbon liquid or other liquid with thermal conductivity.

Figure 4:
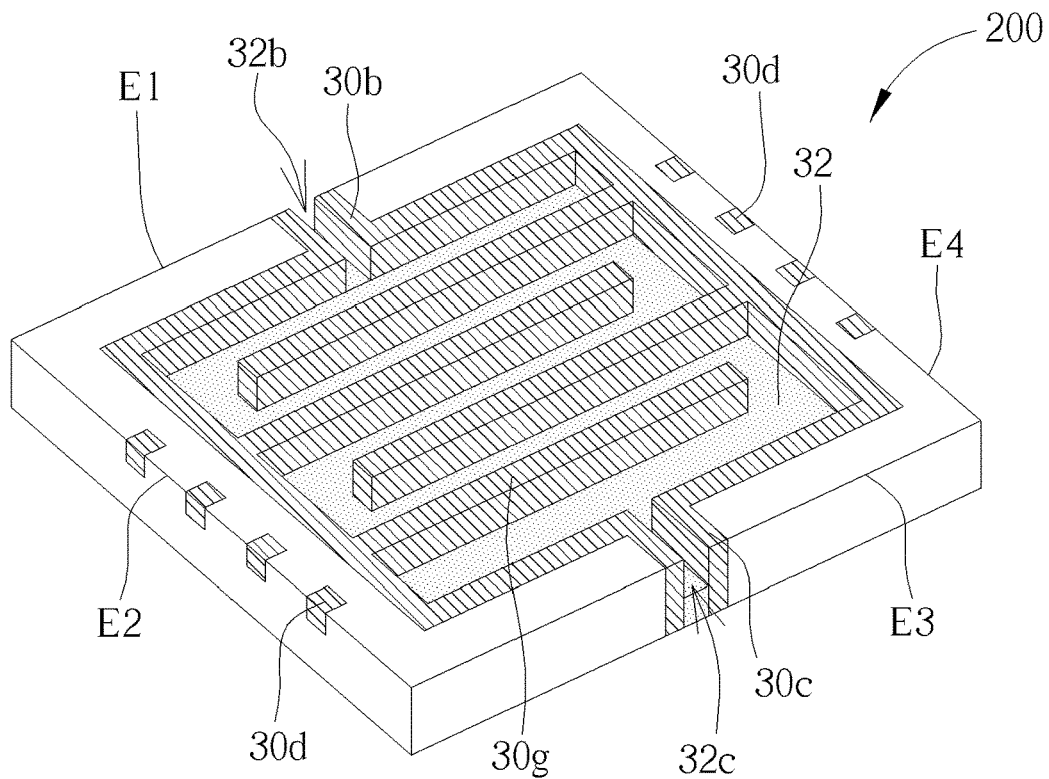
FIG. 4 depicts a QFN package according to another preferred embodiment of the present invention.

FIG. 4 depicts a QFN package according to another preferred embodiment of the present invention. FIG. 4 shows a coolant passage within the QFN package and pads outside of the QFN package. Elements which are substantially the same as those in the embodiment of FIG. 3 are denoted by the same reference numerals; an accompanying explanation is therefore omitted.

As shown in FIG. 4, the first extend portion 30b of the QFN package 200 connects to the first sidewall E1, and the second extend portion 30c connects to the third sidewall E3. The pads 30d are only disposed at the second sidewall E2 and the fourth sidewall E4. That is, there is no pad 30d on the first sidewall E1 and the third sidewall E3. Other elements in the QFN package 200 are the same as those in the QFN package 100, and detailed description is therefore omitted.

Figure 5:
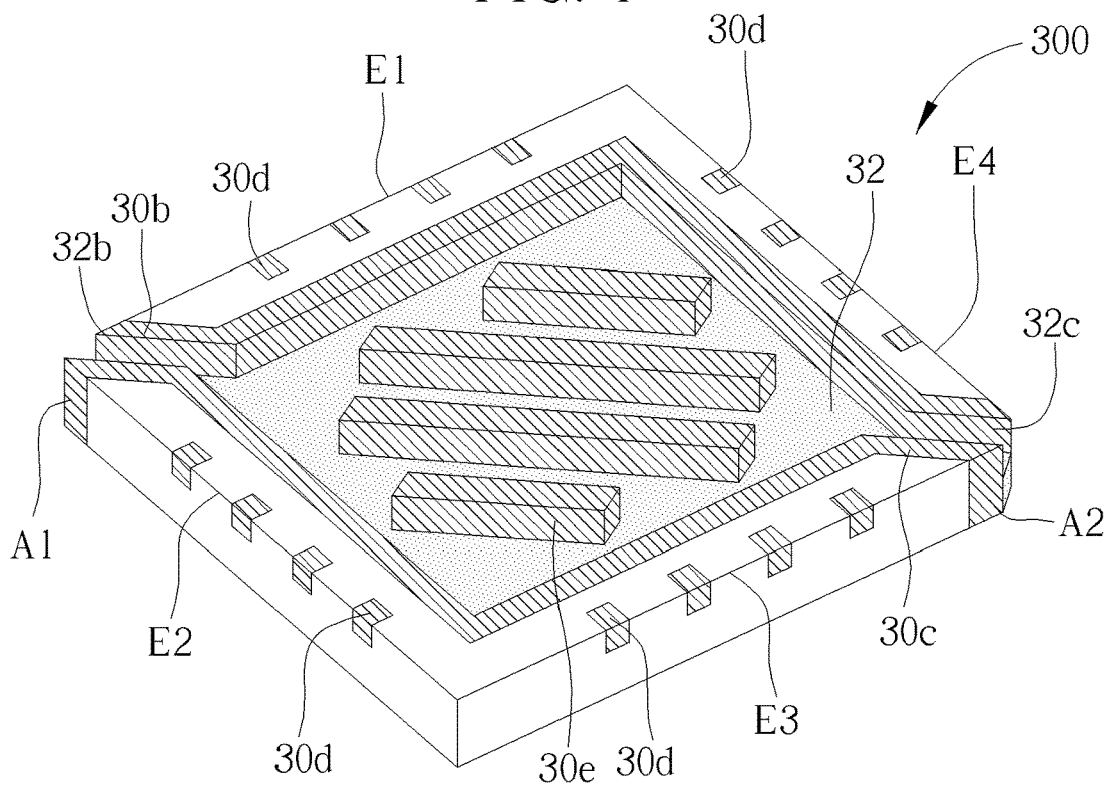
FIG. 5 depicts a QFN package according to another preferred embodiment of the present invention.

FIG. 5 depicts a QFN package according to another preferred embodiment of the present invention. FIG. 5 shows a coolant passage within the QFN package and pads outside of the QFN package. Elements which are substantially the same as those in the embodiment of FIG. 3 are denoted by the same reference numerals; an accompanying explanation is therefore omitted.

The shape of the coolant passage 32 of the QFN package 300 is different from the coolant passage 32 of the QFN package 100. As shown in FIG. 5, numerous support walls 30e are disposed within the die paddle 30a, the support walls 30e are parallel to each other, and the coolant passage 32 is between the support walls 30e. Other elements in the QFN package 300 are the same as those in the QFN package 100, and detailed description is therefore omitted.

Figure 6:
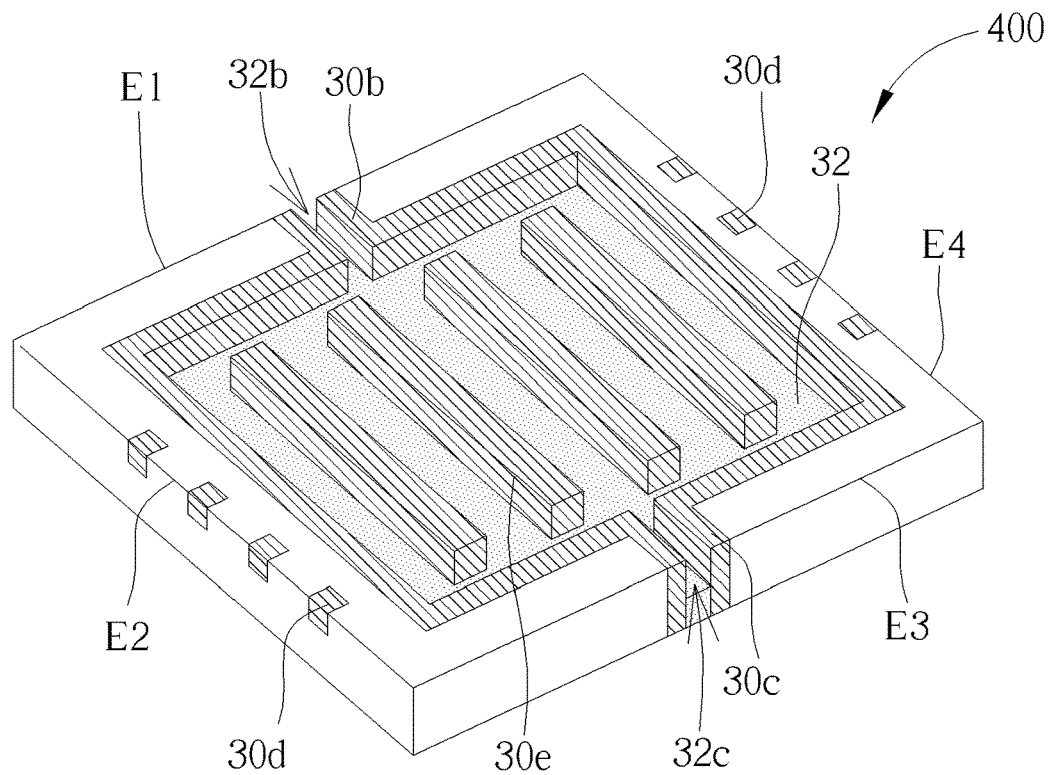
FIG. 6 depicts a QFN package according to another preferred embodiment of the present invention.

FIG. 6 depicts a QFN package according to another preferred embodiment of the present invention. FIG. 6 shows a coolant passage within the QFN package and pads outside of the QFN package. Elements which are substantially the same as those in the embodiment of FIG. 4 are denoted by the same reference numerals; an accompanying explanation is therefore omitted.

The shape of the coolant passage 32 of the QFN package 400 in FIG. 6 is different from the coolant passage 32 of the QFN package 200 in FIG. 4. As shown in FIG. 6, numerous support walls 30e are disposed within the die paddle 30a, the support walls 30e are parallel to each other, and the coolant passage 32 is between the support walls 30e. Other elements in the QFN package 400 are the same as those in the QFN package 200, and detailed description is therefore omitted.

Figure 7:
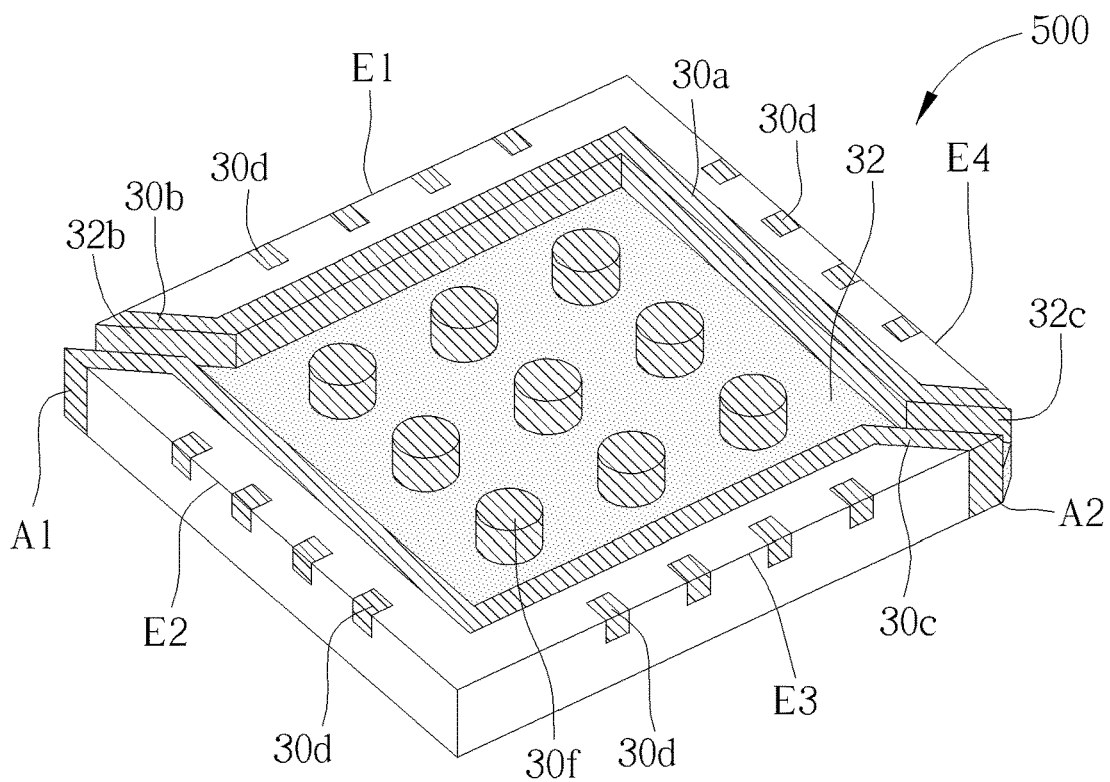
FIG. 7 depicts a QFN package according to another preferred embodiment of the present invention.

FIG. 7 depicts a QFN package according to another preferred embodiment of the present invention. FIG. 7 shows a coolant passage within the QFN package and pads outside of the QFN package. Elements which are substantially the same as those in the embodiment of FIG. 3 are denoted by the same reference numerals; an accompanying explanation is therefore omitted.

The shape of the coolant passage 32 of the QFN package 500 in FIG. 7 is different from the coolant passage 32 of the QFN package 100 in FIG. 3. As shown in FIG. 7, numerous columns 30f are disposed within the die paddle 30a, and the coolant passage 32 is between the support columns 30f. Other elements in the QFN package 500 are the same as those in the QFN package 100, and detailed description is therefore omitted.

Figure 8:
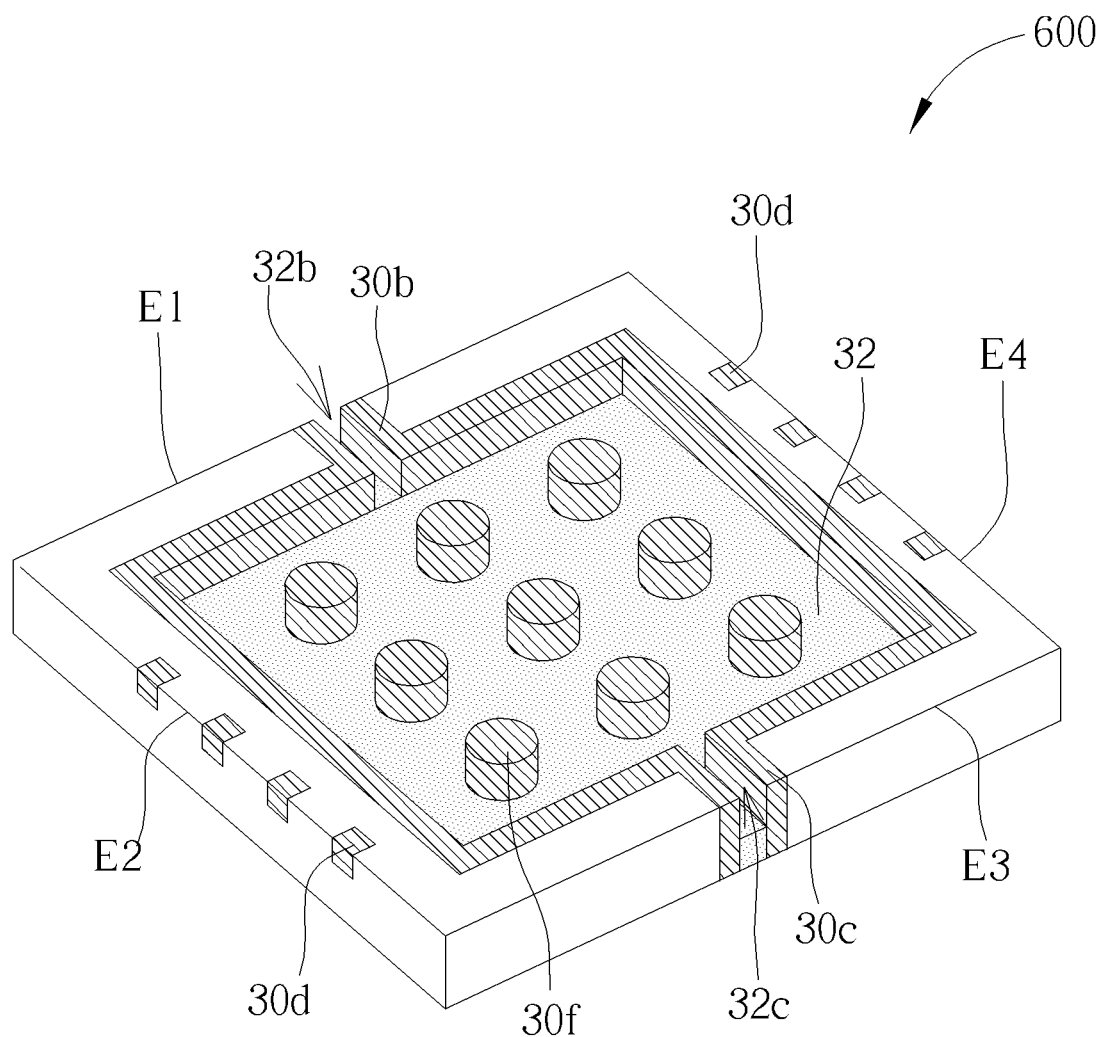
FIG. 8 depicts a QFN package according to another preferred embodiment of the present invention.

FIG. 8 depicts a QFN package according to another preferred embodiment of the present invention. FIG. 8 shows a coolant passage within the QFN package and pads outside of the QFN package. Elements which are substantially the same as those in the embodiment of FIG. 4 are denoted by the same reference numerals; an accompanying explanation is therefore omitted.

The shape of the coolant passage 32 of the QFN package 600 in FIG. 8 is different from the coolant passage 32 of the QFN package 200 in FIG. 4. As shown in FIG. 8, numerous columns 30f are disposed within the die paddle 30a, and the coolant passage 32 is between the support columns 30f. Other elements in the QFN package 600 are the same as those in the QFN package 200, and detailed description is therefore omitted.

In the present invention, passage patterns are defined on the upper lead frame and the lower lead frame, and then the upper lead frame and the lower lead frame are adhered to each other to form a copper lead frame, so that a coolant passage can be formed in the die paddle. That is, the coolant passage is sandwiched inside the die paddle. In this way, coolant can be input into the coolant passage to dissipate heat of the die. The present invention specially suitable for dies of 5G high frequency communication formed by gallium nitride because of their higher requirements for heat dissipation under high voltage conditions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quad flat no leads (QFN) package, comprising:
a copper lead frame comprising a die paddle, a pad, a first extend portion and a second extend portion, wherein the first extend portion and the second extend portion are respectively extend from the die paddle;
a die fixed on the die paddle, wherein the die comprises a conductive bond disposed at a surface of the die;
a coolant passage disposed within the die paddle;
an inlet passage disposed within the first extend portion, wherein the inlet passage connects to one end of the coolant passage;
an outlet passage disposed within the second extend portion, wherein the outlet passage connects to another end of the coolant passage;
a wire electrically connects to the pad and the conductive bond; and
a mold compound encapsulating the copper lead frame, the die and the wire.

2. The QFN package of claim 1, wherein the copper lead frame is formed by adhering a upper copper lead frame to a lower copper lead frame, the upper copper lead frame comprises a first pattern, the lower copper lead frame comprises a second pattern, and the first pattern is the same as the second pattern.

3. The QFN package of claim 2, wherein the first pattern completely overlaps the second pattern.

4. The QFN package of claim 1, wherein the mold compound comprises a first sidewall, a second sidewall, a third sidewall and a fourth sidewall, the first sidewall is opposed to the third sidewall, and the second sidewall is opposed to the fourth sidewall.

5. The QFN package of claim 4, wherein the copper lead frame further comprises a plurality of the pads.

6. The QFN package of claim 5, wherein the plurality of the pads are only disposed at the second sidewall and the fourth sidewall, and the first extend portion connects to the first sidewall and the second extend portion connects to the third sidewall.

7. The QFN package of claim 5, wherein a first corner is a region where the first sidewall connecting to the second sidewall, a second corner is a region where the third sidewall connecting to the fourth sidewall, and the plurality of the pads are disposed at the first sidewall, the second sidewall, the third sidewall and the fourth sidewall.

8. The QFN package of claim 7, wherein the first extend portion connects to the first corner, and the second extend portion connects to the second corner.

9. The QFN package of claim 1, wherein a plurality of support columns are disposed within the die paddle, and the coolant passage is between the plurality of support columns.

10. The QFN package of claim 1, wherein a plurality of support walls are disposed within the die paddle, the plurality of support walls are parallel to each other, and the coolant passage is between the plurality of support walls.

11. The QFN package of claim 1, wherein an interdigitated pattern is disposed within the die paddle, and the coolant passage is between the interdigitated pattern.

12. The QFN package of claim 1, wherein a bottom of the pad is exposed through the mold compound, and the bottom of the pad is aligned with a bottom of the die paddle.

13. A fabricating method of a quad flat no leads (QFN) package, comprising:
providing a upper copper lead frame and a lower copper lead frame, wherein the upper copper lead frame comprises a first pattern, the lower copper lead frame comprises a second pattern, and the first pattern is the same as the second pattern;
adhering the upper copper lead frame to the lower copper lead frame to form a copper lead frame, wherein the first pattern completely overlaps the second pattern, the copper lead frame comprises a die paddle and a pad, and a coolant passage is disposed within the die paddle;
providing a die and the die fixed on the die paddle;
providing a wire to electrically connecting the pad and the die; and
forming a mold compound encapsulating the copper lead frame, the die and the wire.

14. The fabricating method of a QFN package of claim 13, wherein the copper lead frame further comprises a first extend portion and a second extend portion, the first extend portion and the second extend portion are respectively extend from the die paddle, an inlet passage is disposed within the first extend portion, the inlet passage connects to one end of the coolant passage, an outlet passage is disposed within the second extend portion, and the outlet passage connects to another end of the coolant passage.

15. The fabricating method of a QFN package of claim 13, wherein mold compound comprises a first sidewall, a second sidewall, a third sidewall and a fourth sidewall, the first sidewall is opposed to the third sidewall, and the second sidewall is opposed to the fourth sidewall.

16. The fabricating method of a QFN package of claim 15, wherein the copper lead frame further comprises a plurality of the pads, the plurality of the pads are only disposed at the second sidewall and the fourth sidewall, and the first extend portion connects to the first sidewall and the second extend portion connects to the third sidewall.

17. The fabricating method of a QFN package of claim 15, wherein the copper lead frame further comprises a plurality of the pads, the plurality of the pads are disposed on the first sidewall, the second sidewall, the third sidewall and the fourth sidewall, a first corner is a region where the first sidewall connecting to the second sidewall, a second corner is a region where the third sidewall connecting to the fourth sidewall, the first extend portion connects to the first corner, and the second extend portion connects to the second corner.

18. The fabricating method of a QFN package of claim 13, wherein a plurality of support columns are disposed within the die paddle, and the coolant passage is between the plurality of support columns.

19. The fabricating method of a QFN package of claim 13, wherein a plurality of support walls are disposed within the die paddle, the plurality of support walls are parallel to each other, and the coolant passage is between the plurality of support walls.

20. The fabricating method of a QFN package of claim 13, wherein an interdigitated pattern is disposed within the die paddle, and the coolant passage is between the interdigitated pattern.

* * * * *